(12) United States Patent
Huang et al.

(10) Patent No.: US 11,742,298 B2
(45) Date of Patent: Aug. 29, 2023

(54) ALIGNMENT MARK DESIGN FOR PACKAGES

(71) Applicant: Taiwan Semiconductor Manufacturing Company, Ltd., Hsinchu (TW)

(72) Inventors: Li-Hsien Huang, Zhubei (TW); Hsien-Wei Chen, Hsinchu (TW); Ching-Wen Hsiao, Hsinchu (TW); Der-Chyang Yeh, Hsinchu (TW); Shin-Puu Jeng, Po-Shan Village (TW); Chen-Hua Yu, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 218 days.

(21) Appl. No.: 16/694,555

(22) Filed: Nov. 25, 2019

(65) Prior Publication Data

US 2020/0091086 A1  Mar. 19, 2020

Related U.S. Application Data

(63) Continuation of application No. 15/596,593, filed on May 16, 2017, now Pat. No. 10,522,473, which is a
(Continued)

(51) Int. Cl.
*H01L 23/544* (2006.01)
*H01L 23/31* (2006.01)
(Continued)

(52) U.S. Cl.
CPC .......... *H01L 23/544* (2013.01); *H01L 21/486* (2013.01); *H01L 21/4853* (2013.01); *H01L 21/4857* (2013.01); *H01L 21/56* (2013.01); *H01L 21/565* (2013.01); *H01L 21/6835* (2013.01); *H01L 21/76802* (2013.01); *H01L 21/76877* (2013.01); *H01L 21/78* (2013.01); *H01L 23/3107* (2013.01); *H01L 23/3114* (2013.01); *H01L 23/3128* (2013.01);
(Continued)

(58) Field of Classification Search
CPC . H01L 23/544; H01L 23/481; H01L 23/5226; H01L 2223/544; H01L 2223/54426; H01L 2223/54473–54486
See application file for complete search history.

(56) References Cited

U.S. PATENT DOCUMENTS

| 6,121,067 A | 9/2000 | Canella |
| 6,420,790 B1 | 7/2002 | Koizumi |

(Continued)

FOREIGN PATENT DOCUMENTS

| CN | 1649148 A | 8/2005 |
| CN | 1864254 A | 11/2006 |

(Continued)

*Primary Examiner* — Sean P Hagan
(74) *Attorney, Agent, or Firm* — Slater Matsil, LLP

(57) ABSTRACT

A package includes a device die, a molding material molding the device die therein, a through-via penetrating through the molding material, and an alignment mark penetrating through the molding material. A redistribution line is on a side of the molding material. The redistribution line is electrically coupled to the through-via.

20 Claims, 22 Drawing Sheets

Related U.S. Application Data continuation of application No. 14/465,474, filed on Aug. 21, 2014, now Pat. No. 9,666,522.

(60) Provisional application No. 62/004,365, filed on May 29, 2014.

(51) Int. Cl.

| | | |
|---|---|---|
| *H01L 21/48* | (2006.01) | |
| *H01L 23/538* | (2006.01) | |
| *H01L 23/00* | (2006.01) | |
| *H01L 25/10* | (2006.01) | |
| *H01L 25/00* | (2006.01) | |
| *H01L 23/48* | (2006.01) | |
| *H01L 21/768* | (2006.01) | |
| *H01L 23/522* | (2006.01) | |
| *H01L 21/56* | (2006.01) | |
| *H01L 21/78* | (2006.01) | |
| *H01L 23/498* | (2006.01) | |
| *H01L 21/683* | (2006.01) | |
| *H01L 25/065* | (2023.01) | |

(52) U.S. Cl.
CPC ...... *H01L 23/481* (2013.01); *H01L 23/49827* (2013.01); *H01L 23/5226* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 24/97* (2013.01); *H01L 25/105* (2013.01); *H01L 25/50* (2013.01); *H01L 21/561* (2013.01); *H01L 23/49816* (2013.01); *H01L 24/29* (2013.01); *H01L 24/32* (2013.01); *H01L 24/48* (2013.01); *H01L 24/73* (2013.01); *H01L 24/83* (2013.01); *H01L 24/92* (2013.01); *H01L 25/0657* (2013.01); *H01L 2221/68318* (2013.01); *H01L 2221/68372* (2013.01); *H01L 2221/68381* (2013.01); *H01L 2223/5442* (2013.01); *H01L 2223/54426* (2013.01); *H01L 2223/54433* (2013.01); *H01L 2223/54486* (2013.01); *H01L 2224/04042* (2013.01); *H01L 2224/04105* (2013.01); *H01L 2224/12105* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/83132* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2225/1082* (2013.01); *H01L 2924/00014* (2013.01); *H01L 2924/1431* (2013.01); *H01L 2924/1436* (2013.01); *H01L 2924/1437* (2013.01); *H01L 2924/15311* (2013.01); *H01L 2924/181* (2013.01)

(56) References Cited

U.S. PATENT DOCUMENTS

| | | |
|---|---|---|
| 6,423,908 B1 | 7/2002 | Liu |
| 6,680,220 B2 | 1/2004 | Minamio et al. |
| 7,053,495 B2 | 5/2006 | Tsuura |
| 7,795,717 B2 | 9/2010 | Goller |
| 8,097,965 B2 | 1/2012 | Takata |
| 8,110,923 B2 | 2/2012 | Wantanabe |
| 8,178,964 B2 | 5/2012 | Yang |
| 8,242,603 B2 | 8/2012 | Check et al. |
| 8,563,403 B1 | 10/2013 | Farooq et al. |
| 9,000,584 B2 | 4/2015 | Lin et al. |
| 9,385,102 B2 | 7/2016 | Lin et al. |
| 9,508,696 B2 | 11/2016 | Chen |
| 9,721,933 B2 | 8/2017 | Chen |
| 2002/0048951 A1 | 4/2002 | Jeong et al. |
| 2003/0015342 A1 | 1/2003 | Sakamoto et al. |
| 2004/0201097 A1 | 10/2004 | Ohsumi |
| 2005/0104224 A1 | 5/2005 | Huang et al. |
| 2005/0161837 A1 | 7/2005 | Matsui |
| 2006/0202359 A1 | 9/2006 | Chen |
| 2007/0075436 A1 | 4/2007 | Watanabe et al. |
| 2007/0164432 A1 | 7/2007 | Wakisaka et al. |
| 2007/0220742 A1 | 9/2007 | Lo et al. |
| 2008/0121269 A1 | 5/2008 | Welser et al. |
| 2008/0284048 A1 | 11/2008 | Kim et al. |
| 2008/0316714 A1 | 12/2008 | Eichelberger et al. |
| 2009/0045488 A1 | 2/2009 | Chang et al. |
| 2009/0236739 A1 | 9/2009 | Chen et al. |
| 2009/0302486 A1 | 12/2009 | Terashima et al. |
| 2010/0078655 A1 | 4/2010 | Yang |
| 2010/0144101 A1 | 6/2010 | Chow et al. |
| 2010/0171205 A1 | 7/2010 | Chen et al. |
| 2010/0187671 A1 | 7/2010 | Lin et al. |
| 2010/0224876 A1* | 9/2010 | Zhu .............. H01L 27/0694 257/52 |
| 2010/0233831 A1 | 9/2010 | Pohl et al. |
| 2010/0283138 A1 | 11/2010 | Chen et al. |
| 2010/0301474 A1 | 12/2010 | Yang |
| 2011/0018124 A1 | 1/2011 | Yang et al. |
| 2011/0084382 A1 | 4/2011 | Chen et al. |
| 2011/0147911 A1 | 6/2011 | Kohl et al. |
| 2011/0278736 A1 | 11/2011 | Lin et al. |
| 2011/0291249 A1 | 12/2011 | Chi et al. |
| 2012/0056315 A1 | 3/2012 | Chang et al. |
| 2012/0217645 A1 | 8/2012 | Pagaila |
| 2012/0247291 A1 | 10/2012 | Kawada |
| 2013/0250298 A1 | 9/2013 | Komuta et al. |
| 2014/0057394 A1 | 2/2014 | Ramasamy et al. |
| 2014/0077366 A1 | 3/2014 | Kim et al. |
| 2014/0110858 A1 | 4/2014 | Beer et al. |
| 2014/0175657 A1 | 6/2014 | Oka et al. |
| 2014/0264846 A1 | 9/2014 | Chen et al. |
| 2014/0374922 A1 | 12/2014 | Huang et al. |
| 2015/0294939 A1 | 10/2015 | Yu et al. |
| 2015/0340308 A1 | 11/2015 | Law et al. |

FOREIGN PATENT DOCUMENTS

| | | |
|---|---|---|
| CN | 101325188 A | 12/2008 |
| CN | 100468714 C | 3/2009 |
| CN | 100543953 C | 9/2009 |
| CN | 101740551 A | 6/2010 |
| CN | 102347251 B | 5/2013 |
| CN | 103187388 A | 7/2013 |
| CN | 103715104 A | 4/2014 |
| DE | 10320646 A1 | 9/2004 |
| JP | 3670634 B2 | 7/2005 |
| KR | 20070051038 A | 5/2007 |
| KR | 100878933 B1 | 1/2009 |

* cited by examiner

ALIGNMENT MARK DESIGN FOR PACKAGES

PRIORITY CLAIM AND CROSS-REFERENCE

This application is a continuation of U.S. patent application Ser. No. 15/596,593, entitled "Alignment Mark Design for Packages," filed on May 16, 2017, which is a continuation of U.S. patent application Ser. No. 14/465,474, entitled "Alignment Mark Design for Packages," filed on Aug. 21, 2014, now U.S. Pat. No. 9,666,522 issued May 30, 2017, which claims the benefit of Provisional Application No. 62/004,365, filed May 29, 2014, and entitled "Through Integrated Fan-out Via Alignment Mark Structure," which applications are hereby incorporated herein by reference.

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips and connect interior integrated circuits to exterior pins.

With the increasing demand for more functions, Package-on-Package (PoP) technology, in which two or more packages are bonded to expand the integration ability of the packages, was developed. With a high degree of integration, the electrical performance of the resulting PoP package is improved due to the shortened connecting paths between components. By using PoP technology, package design becomes more flexible and less complex. Time-to-market is also reduced.

BRIEF SUMMARY OF THE INVENTION

In accordance with some aspect of the present disclosure, a package includes a device die, a molding material molding the device die therein, a through-via penetrating through the molding material, and an alignment mark penetrating through the molding material. A redistribution line is on a side of the molding material. The redistribution line is electrically coupled to the through-via.

Other embodiments are also disclosed.

The advantageous features of the present disclosure include improved accuracy in alignment without incurring additional manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
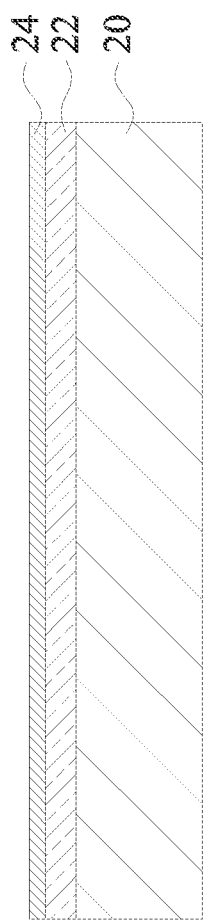
FIGS. 1 through 14 are cross-sectional views and top views of intermediate stages in the manufacturing of packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 14 illustrate the cross-sectional views and top views of intermediate stages in the manufacturing of a package in accordance with embodiments. The steps shown in FIG. 1 through 14 are also illustrated schematically in the process flow 300 shown in FIG. 20. In the subsequent discussion, the process steps shown in FIGS. 1 through 14 are discussed, referring to the process steps in FIG. 20.

FIG. 1 illustrates carrier 20 and release layer 22 formed on carrier 20. Carrier 20 may be a glass carrier, a ceramic carrier, or the like. Carrier 20 may have a round top-view shape and may be a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In some embodiments, release layer 22 is formed of an epoxy-based thermal-release material. In other embodiments, release layer 22 is formed of an ultra-violet (UV) glue. Release layer 22 may be dispensed as a liquid and cured. In alternative embodiments, release layer 22 is a laminate film and is laminated onto carrier 20. The top surface of release layer 22 is leveled and has a high degree of co-planarity.

Dielectric layer 24 is formed on release layer 22. In some embodiments, dielectric layer 24 is formed of a polymer, which may also be a photo-sensitive material such as polybenzoxazole (PBO), polyimide, benzocyclobutene (BCB), or the like, that may be easily patterned using a photo lithography process. In alternative embodiments, dielectric layer 24 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 2:
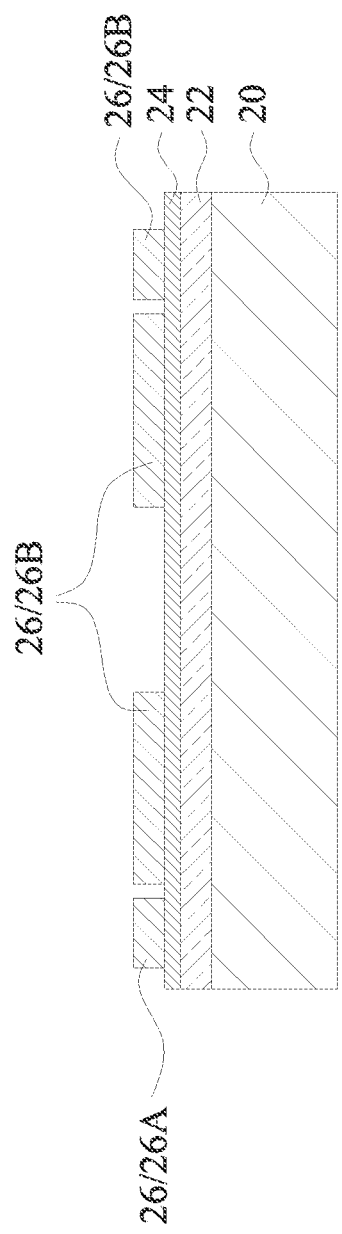
Figure 5A:
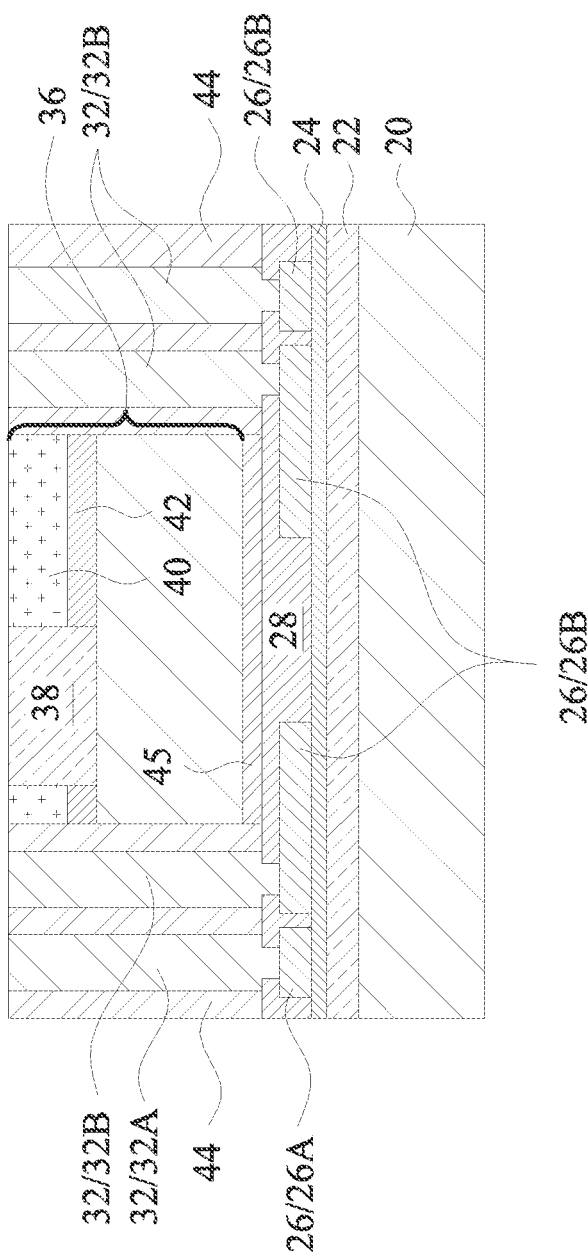

Referring to FIG. 2, Redistribution Lines (RDLs) 26 are formed over dielectric layer 24. RDLs 26 are also referred to as backside RDLs since they are located on the backside of device die 36 (FIG. 5A). RDLs 26 may include RDLs 26B and may or may not include RDL(s) 26A, which, if formed, will be electrically coupled to the subsequently formed alignment marks. The formation of RDLs 26 may include forming a seed layer (not shown) over dielectric layer 24, forming a patterned mask (not shown) such as photo resist over the seed layer, and then performing a metal plating on the exposed seed layer. The patterned mask and the portions of the seed layer covered by the patterned mask are then removed, leaving RDLs 26 as in FIG. 2. In some embodiments, the seed layer comprises a titanium layer and a copper layer over the titanium layer. The seed layer may be formed using, for example, Physical Vapor Deposition (PVD). The plating may be performed using, for example, electroless plating.

Figure 3:
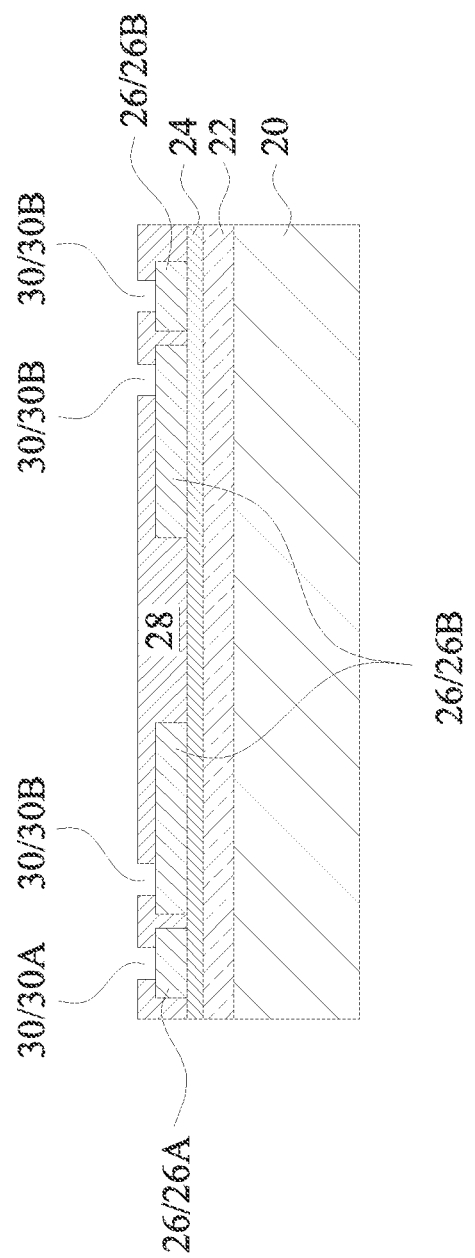

Referring to FIG. 3, dielectric layer 28 is formed on RDLs 26. The bottom surface of dielectric layer 28 may be in contact with the top surfaces of RDLs 26 and dielectric layer 24. In some embodiments, dielectric layer 28 is formed of a polymer, which may be a photo-sensitive material such as PBO, polyimide, BCB, or the like. In alternative embodiments, dielectric layer 28 is formed of a nitride such as silicon nitride, an oxide such as silicon oxide, PSG, BSG, BPSG, or the like. Dielectric layer 28 is then patterned to form openings 30 therein. Hence, RDLs 26 are exposed through the openings 30 in dielectric layer 28. Openings 30 include 30B and may or may not include 30A. For example, if RDLs 26A are not formed, opening 30A is also not formed.

Figure 4A:
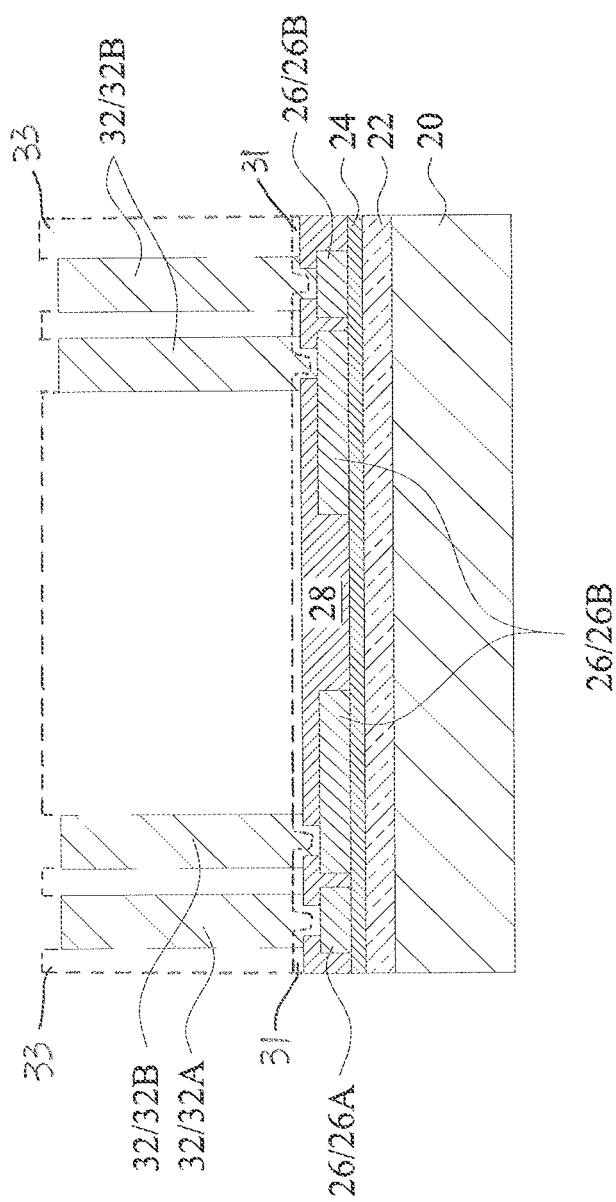

Referring to FIG. 4A, metal posts 32 (including 32A and 32B) are formed. Throughout the description, metal posts 32 are alternatively referred to as through-vias 32 since metal posts 32 penetrate through the subsequently formed molding material. In accordance with some embodiments of the present disclosure, through-vias 32 are formed by plating. The plating of through-vias 32 may include forming a blanket seed layer (schematically illustrated as 31) over layer 28 and extending into openings 30, forming and patterning photo resist 33, and plating through-vias 32 on the portions of seed layer that are exposed through the openings in photo resist 33. The photo resist 33 and the portions of seed layer 31 that were covered by photo resist 33 are then removed, and hence are shown using dashed lines. The material of through-vias 32 may include copper, aluminum, or the like. Through-vias 32 have the shape of rods. The top-view shapes of through-vias 32 may be circles, rectangles, squares, hexagons, or the like.

Figure 4B:
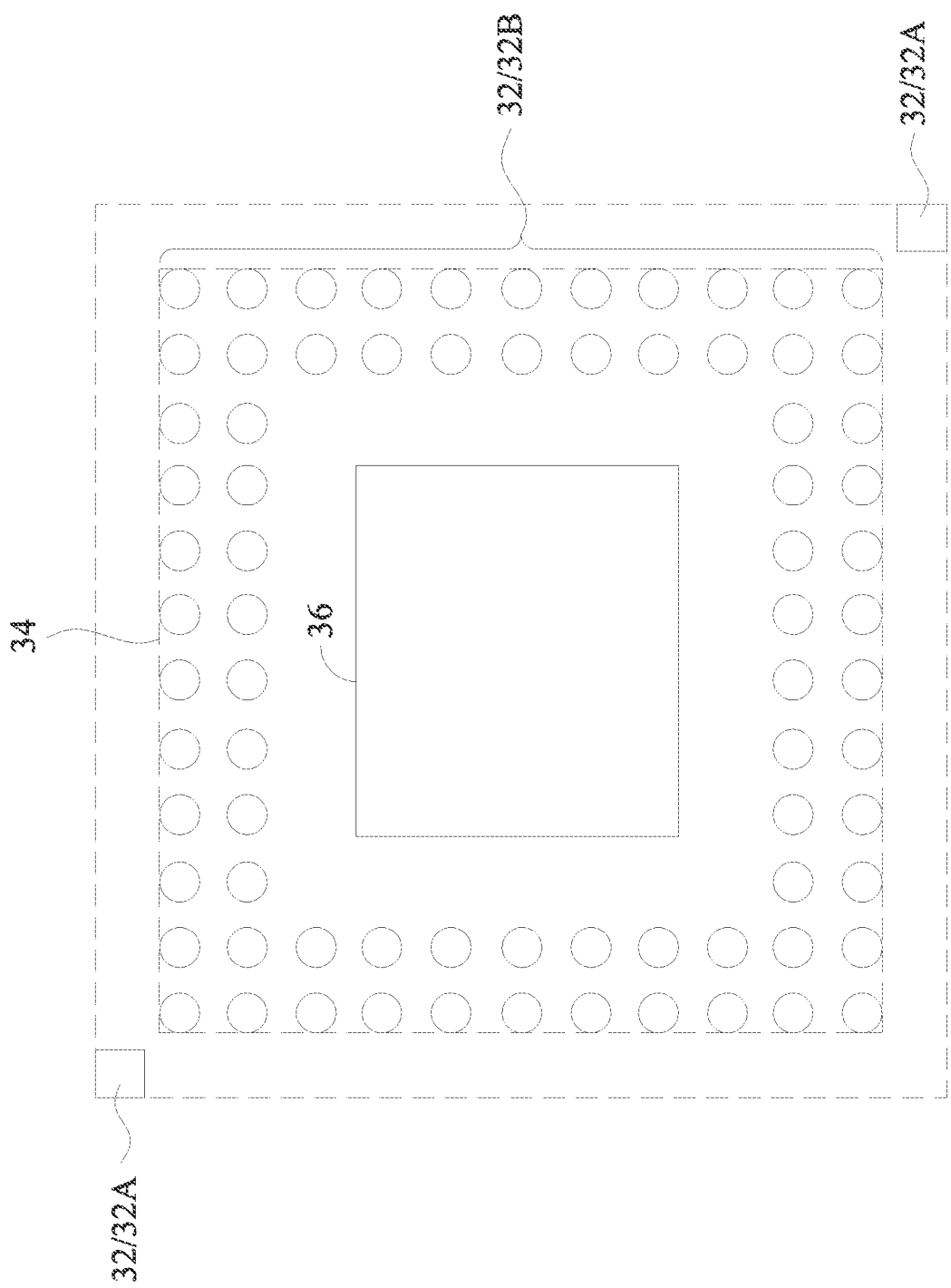

Through-vias 32 includes 32A and 32B. FIG. 4B illustrates a top view of through-vias 32A and 32B. In some embodiments, through-vias 32B are arranged as rows and columns. The outer boundaries of the outmost through-vias 32B may define region 34, which will be referred to as design area 34 hereinafter. No through-via 32B and RDL will be formed outside of design area 34, and no device die will be placed outside of design area 34. Through-vias 32B are used for electrically inter-coupling features on the opposite ends of through-vias 32B. Through-vias 32A, on the other hand, are used as alignment marks and hence are sometimes referred to as alignment marks 32A. Through-vias 32A may not be used for electrical coupling of devices and features.

In accordance with some embodiments of the present disclosure, through-vias 32A are placed outside design area 34. In accordance with alternative embodiments, through-vias 32A may also be placed inside design area 34. In some embodiments, through-vias 32A may have a different top-view shape and/or size from through-vias 32B for easy identification. For example, as shown in FIG. 4B, through-vias 32A have a rectangular or a square top-view shape, while through-vias 32B have a round top-view shape.

FIG. 5A illustrates the placement of device dies 36. Device die 36 is adhered to dielectric layer 28 through Die-Attach Film (DAF) 45, which may be an adhesive film. Device die 36 may be a logic device die including logic transistors therein. In some exemplary embodiments, device die 36 is a die designed for mobile applications and may be a Power Management Integrated Circuit (PMIC) die, a Transceiver (TRX) die, or the like. Although one device die 36 is illustrated, more device dies may be placed over dielectric layer 28.

In some exemplary embodiments, metal pillar(s) 38 (such as a copper post) are pre-formed as the topmost portion of device die 36, wherein metal pillar 38 is electrically coupled to the integrated circuit devices such as transistors in device die 36. In some embodiments, a polymer fills the gaps between neighboring metal pillars 38 to form top dielectric layer 40, wherein top dielectric layer 40 may also be on top of and contact passivation layer 42. Polymer layer 40 may be formed of PBO in some embodiments. In some embodiments, passivation layer 42 comprises silicon nitride, silicon oxynitride, silicon oxide, or multi-layers thereof.

Next, molding material 44 is molded on device die 36. Molding material 44 fills the gaps between neighboring through-vias 32 and the gaps between through-vias 32 and device die 36. Molding material 44 may include a molding compound, a molding underfill, an epoxy, or a resin. The top surface of molding material 44 is higher than the top ends of metal pillar 38.

Next, a planarization such as a Chemical Mechanical Polish (CMP) step or a grinding step is performed to thin molding material 44 until through-vias 32 and metal pillar 38 are exposed. Due to the grinding, the top ends of through-vias 32 are substantially level (coplanar) with the top surfaces of metal pillars 38, and are substantially coplanar with the top surface of molding material 44.

Figure 5B:
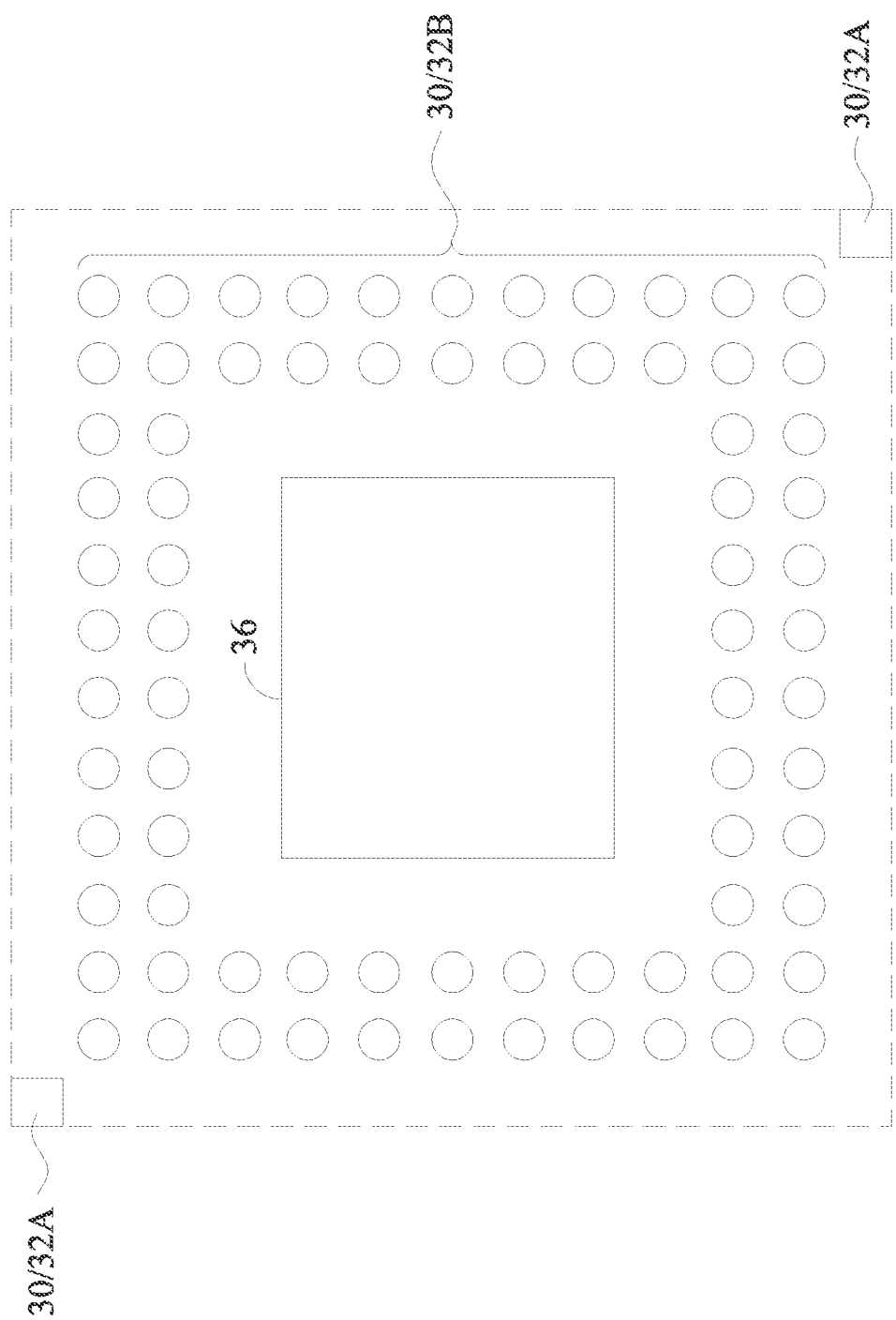

FIG. 5B schematically illustrates a top view of the structure in FIG. 5A. In the placement of device die 36, alignment marks 32A are used to align the position of device die 36 to ensure device die 36 is placed at the desirable location and that device die 36 does not shift or rotate from its intended position and direction. The alignment is performed by determining the relative position of device die 36 relative to the positions of alignment marks 32A.

Figure 5C:
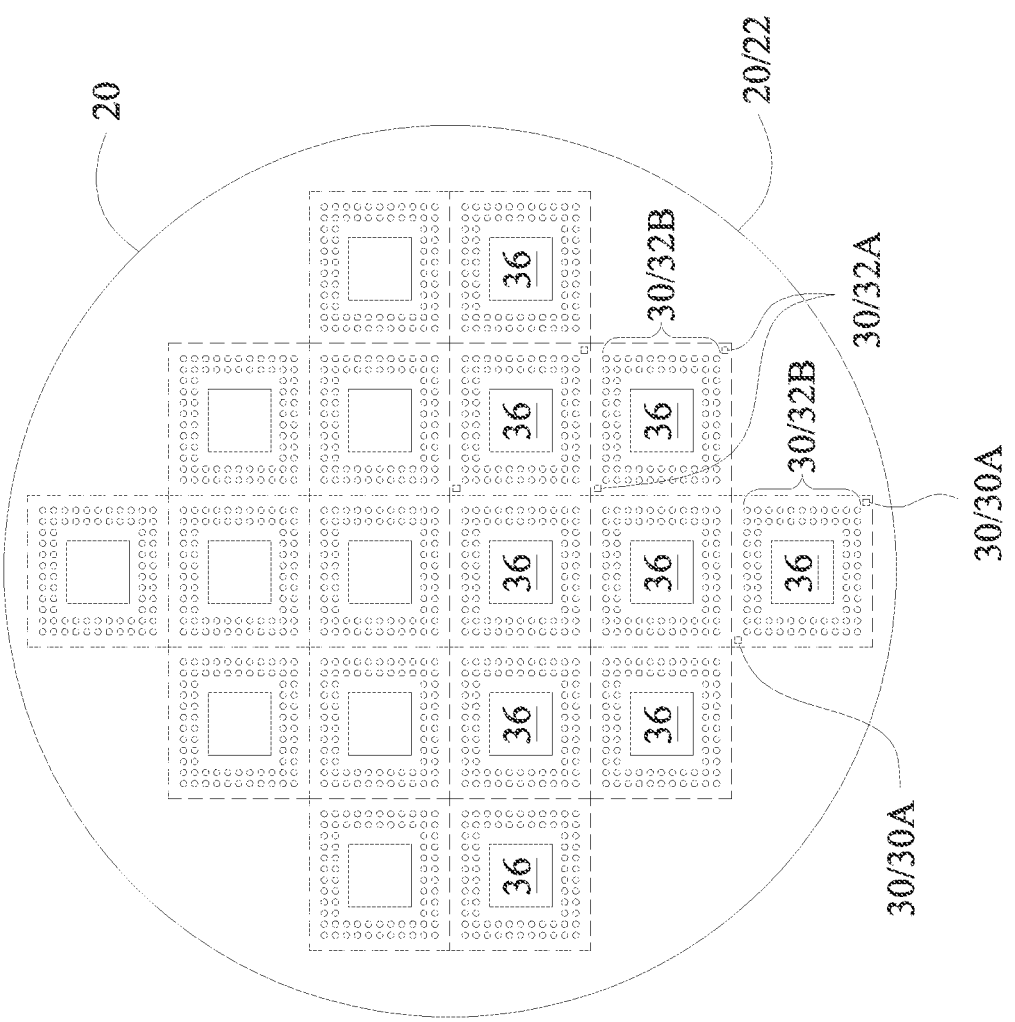

FIG. 5C illustrates a top view including more device die 36 and through-vias 32 placed on carrier 20, which has a round shape in the top view. Similar to the formation of device dies, the structure that is formed in accordance with the embodiments of the present disclosure is to be sawed as a plurality of packages, each including a device die 36 and its surrounding through-vias 32. The placement of each of the device dies 36 may be aligned through aligning to the corresponding alignment marks 32A in the same package.

Figure 6:
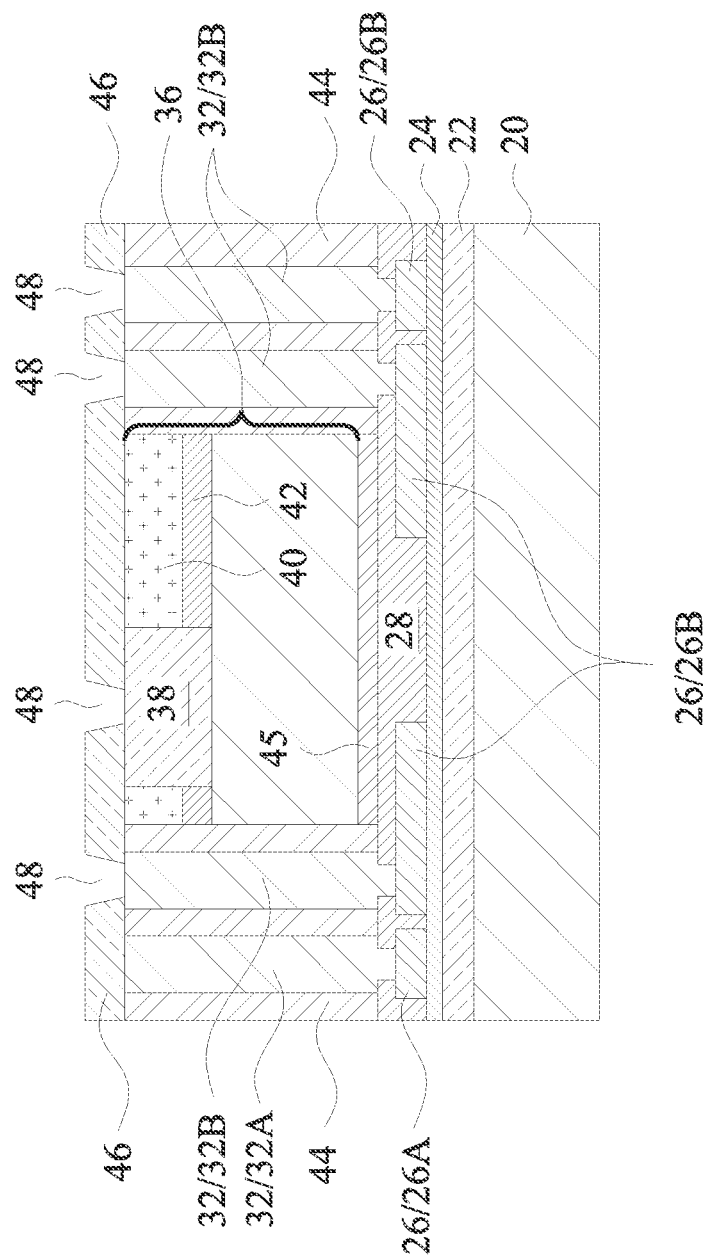

Referring to FIG. 6, dielectric layer 46 is formed. In some embodiments, dielectric layer 46 is formed of a polymer such as PBO, polyimide, or the like. In alternative embodiments, dielectric layer 46 is formed of silicon nitride, silicon oxide, or the like. Openings 48 are formed in dielectric layer 46 to expose through-vias 32B and metal pillars 38. The formation of openings 48 may be performed through a photo lithography process. In accordance with some embodiments of the present disclosure, no openings are formed over through-vias 32A, and hence through-vias 32A are not exposed. In alternative embodiments, through-vias 32A may be exposed through some openings 48.

In accordance with some embodiments, the formation of openings 48 is also performed using alignment marks 32A as alignment marks so that openings 48 may be accurately aligned to the respective through-vias 32 and metal pillar 38.

Figure 7:
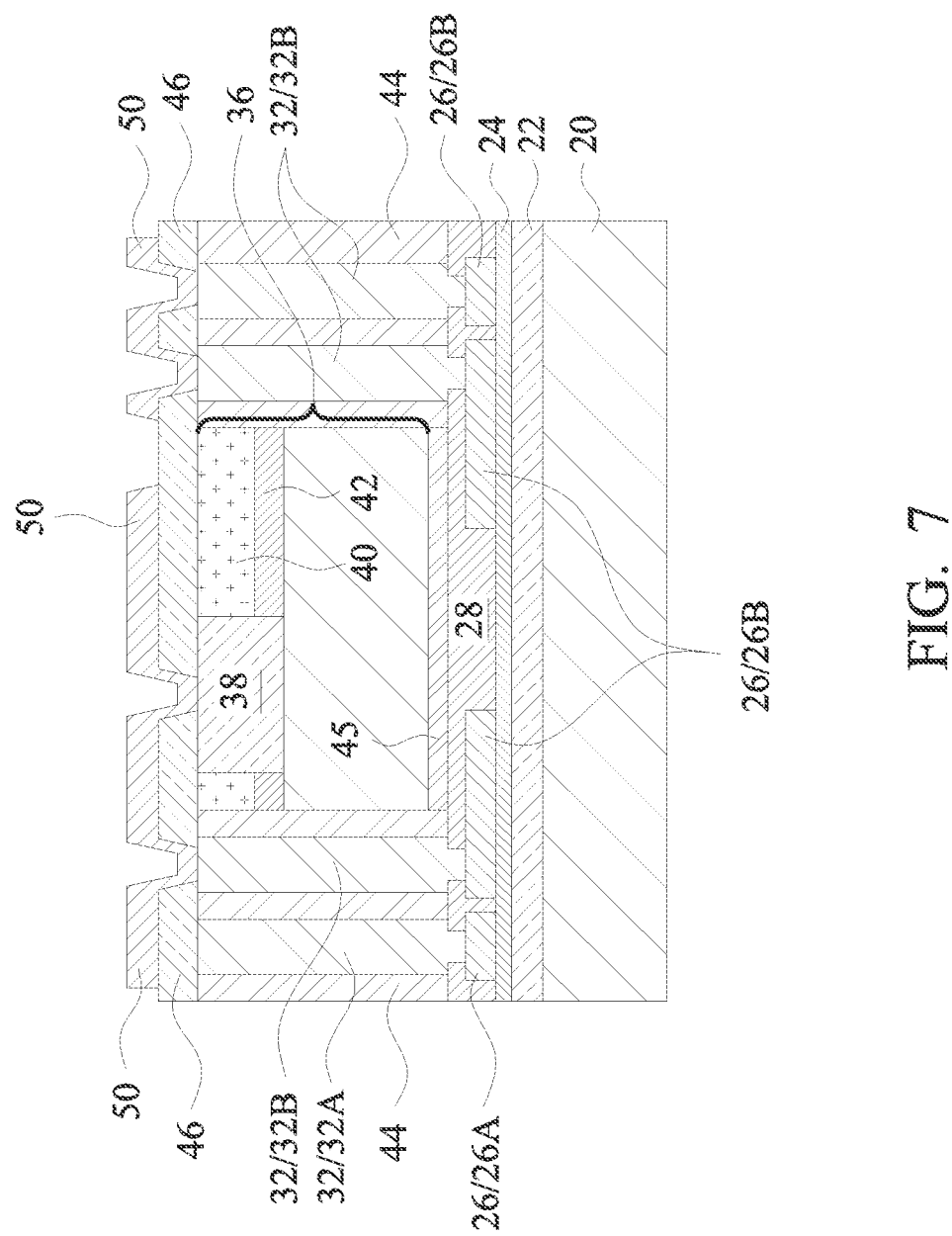

Next, referring to FIG. 7, Redistribution Lines (RDLs) 50 are formed to connect to metal pillar 38 and through-vias 32B. RDLs 50 may also interconnect metal pillar 38 and through-vias 32B. RDLs 50 include metal traces (metal lines) over dielectric layer 46 as well as vias extending into openings 48 to electrically connect to through-vias 32B and metal pillar 38. In some embodiments, RDLs 50 are formed in a plating process, wherein each of RDLs 50 includes a seed layer (not shown) and a plated metallic material over the seed layer. The seed layer and the plated material may be formed of the same material or different materials. RDLs 50 may comprise a metal or a metal alloy including aluminum, copper, tungsten, and alloys thereof.

Figure 8:
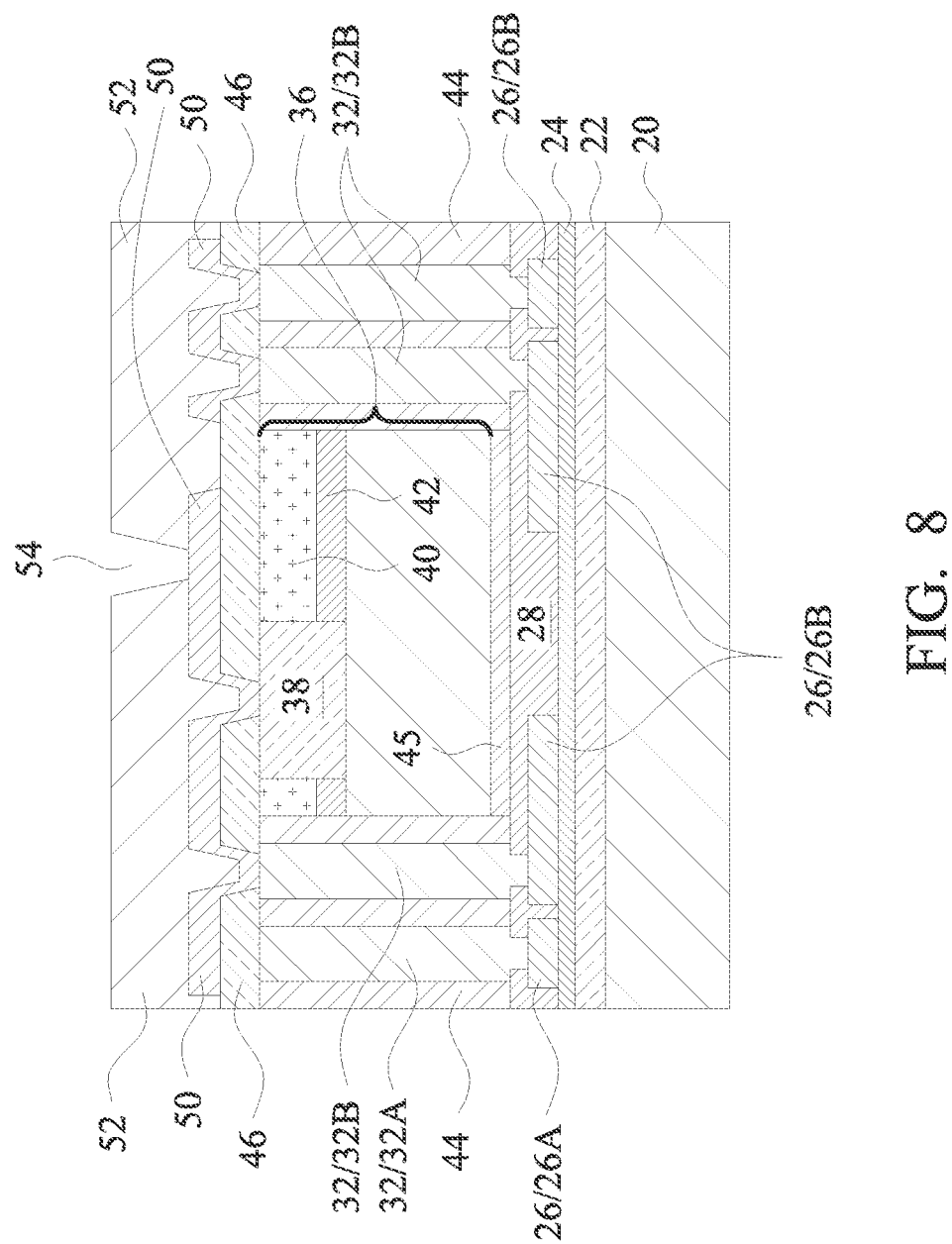

Referring to FIG. 8, dielectric layer 52 is formed over RDLs 50 and dielectric layer 46. Dielectric layer 52 may be formed using a polymer, which may be selected from the same candidate materials as those of dielectric layer 46. For example, dielectric layers 52 may comprise PBO, polyimide, BCB, or the like. Alternatively, dielectric layer 52 may include non-organic dielectric materials such as silicon oxide, silicon nitride, silicon carbide, silicon oxynitride, or the like. Opening(s) 54 are also formed in dielectric layer 52 to expose RDLs 50. The formation of openings 54 may be performed through a photo lithography process.

Figure 9:
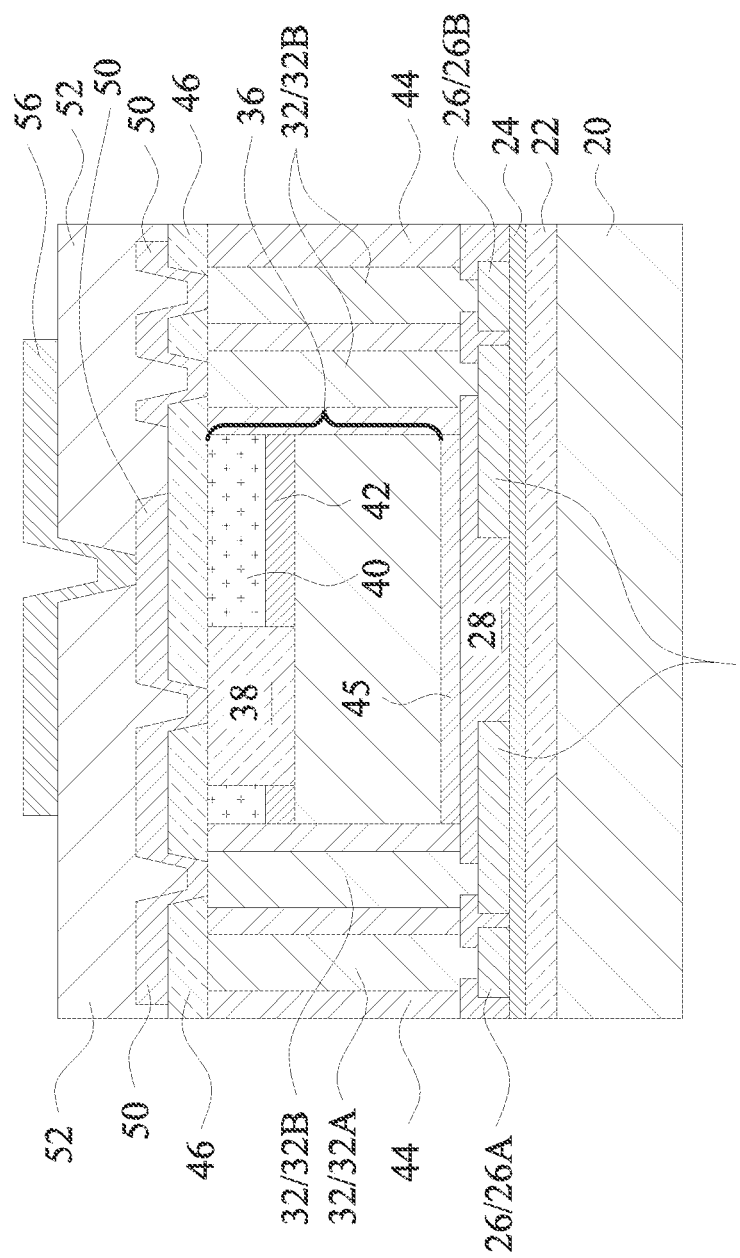

FIG. 9 illustrates the formation of RDLs 56, which are electrically connected to RDLs 50 through opening(s) 54 (FIG. 8). The formation of RDLs 56 may adopt similar methods and materials to those for forming RDLs 50. RDLs 50 and 56 are also referred to as front-side RDLs since they are located on the front side of device die 36.

Figure 10:
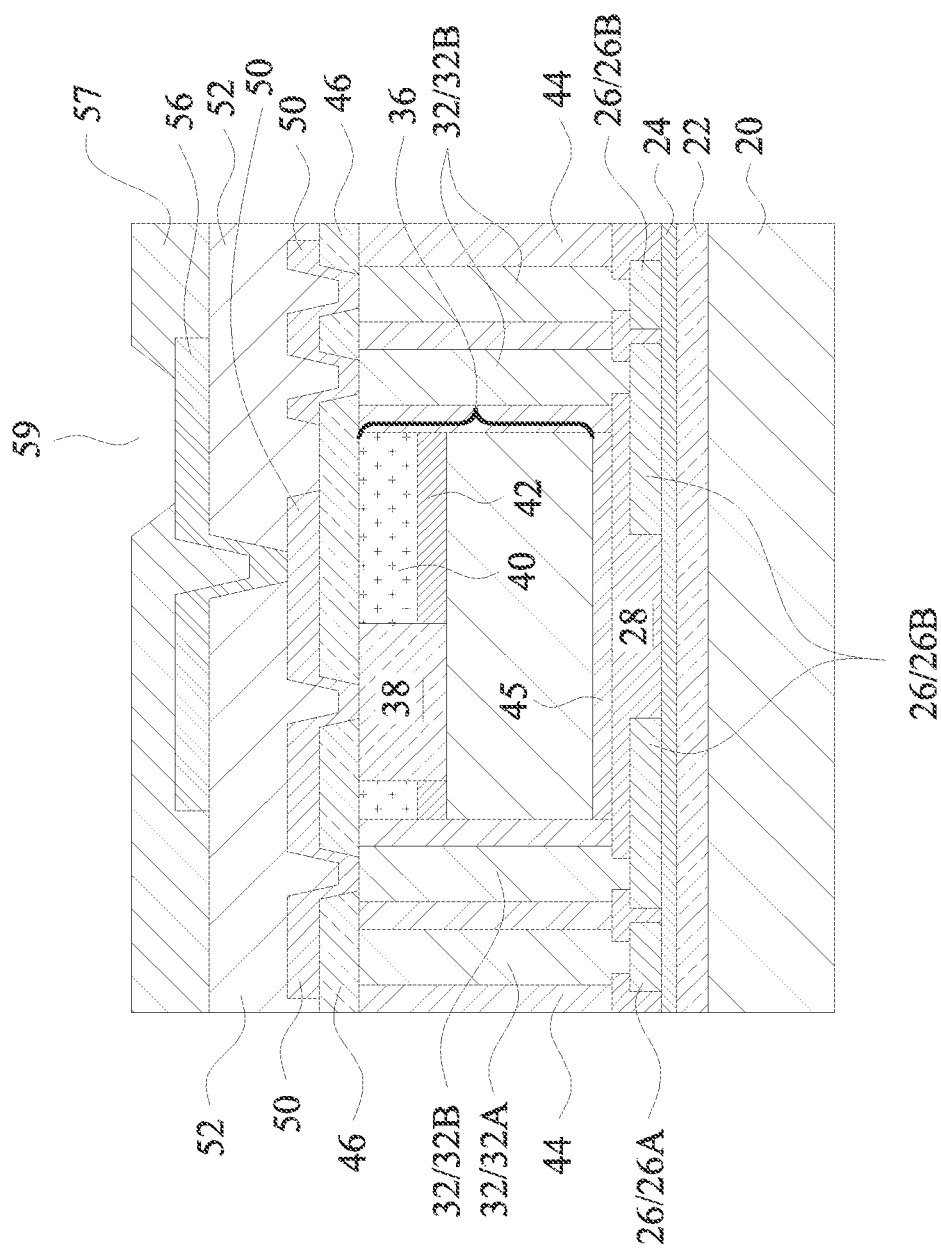

As shown in FIG. 10, an additional dielectric layer 57, which may be polymer, is formed to cover RDLs 56 and dielectric layer 52. Dielectric layer 57 may also be a polymer, which is selected from the same candidate polymers used for forming dielectric layers 46 and 52. Opening(s) 59 are then formed in dielectric layer 57 to expose the metal pad portions of RDLs 56.

Figure 11:
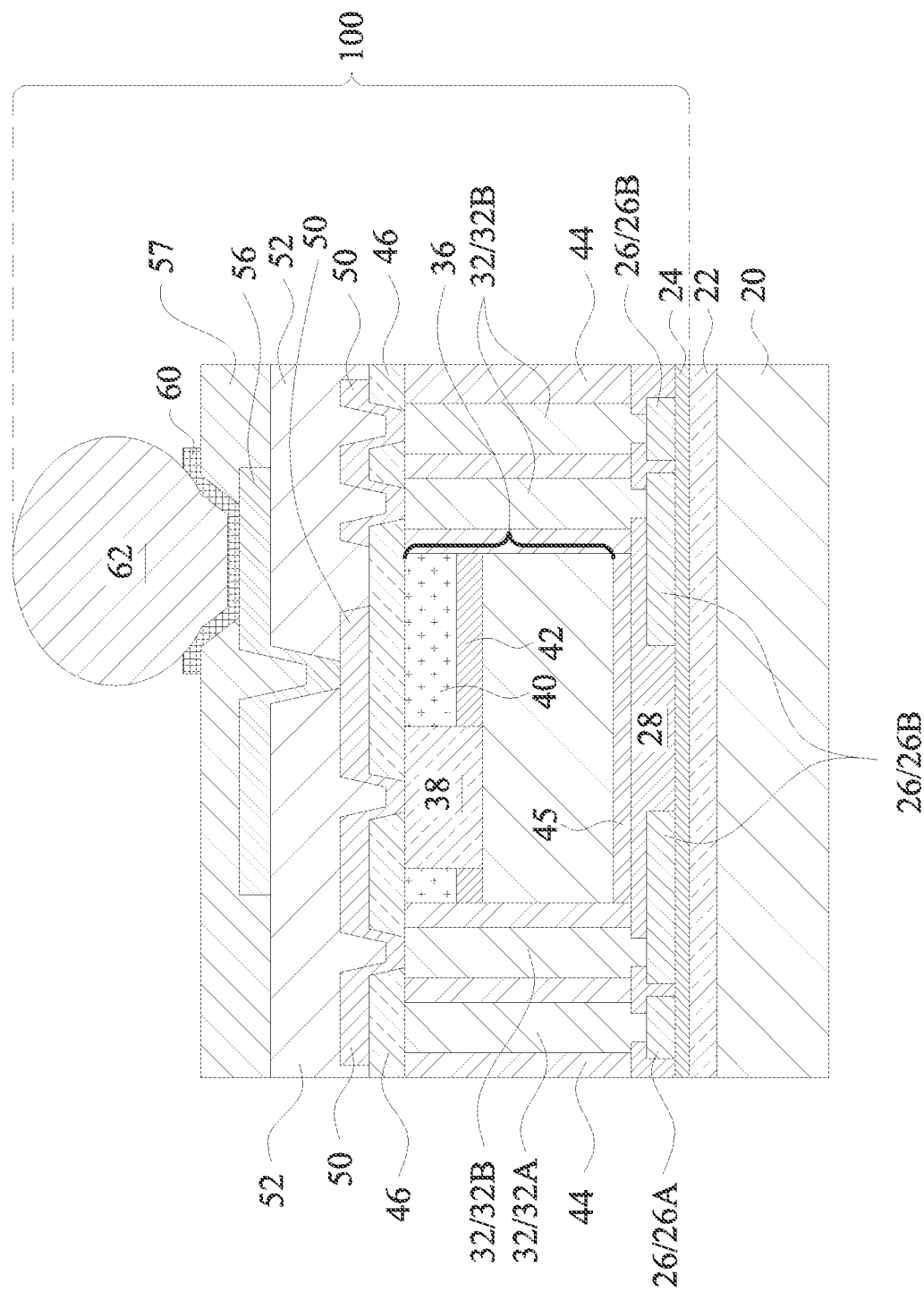

FIG. 11 illustrates the formation of Under-Bump Metallurgies (UBMs) 60 and electrical connectors 62 in accordance with some exemplary embodiments. The formation of UBMs 60 may include deposition and patterning. The formation of electrical connectors 62 may include placing solder balls on the exposed portions of UBMs 60 and then reflowing the solder balls. In alternative embodiments, the formation of electrical connectors 62 includes performing a plating step to form solder regions over RDLs 56 and then reflowing the solder regions. Electrical connectors 62 may also include metal pillars or metal pillars and solder caps, which may also be formed through plating. Throughout the description, the combined structure, including device die 36, through-vias 32, molding material 44, and the corresponding RDLs and dielectric layers on the opposite sides of molding material 44, will be referred to as package 100, which may be a composite wafer with a round top-view shape.

Figure 12:
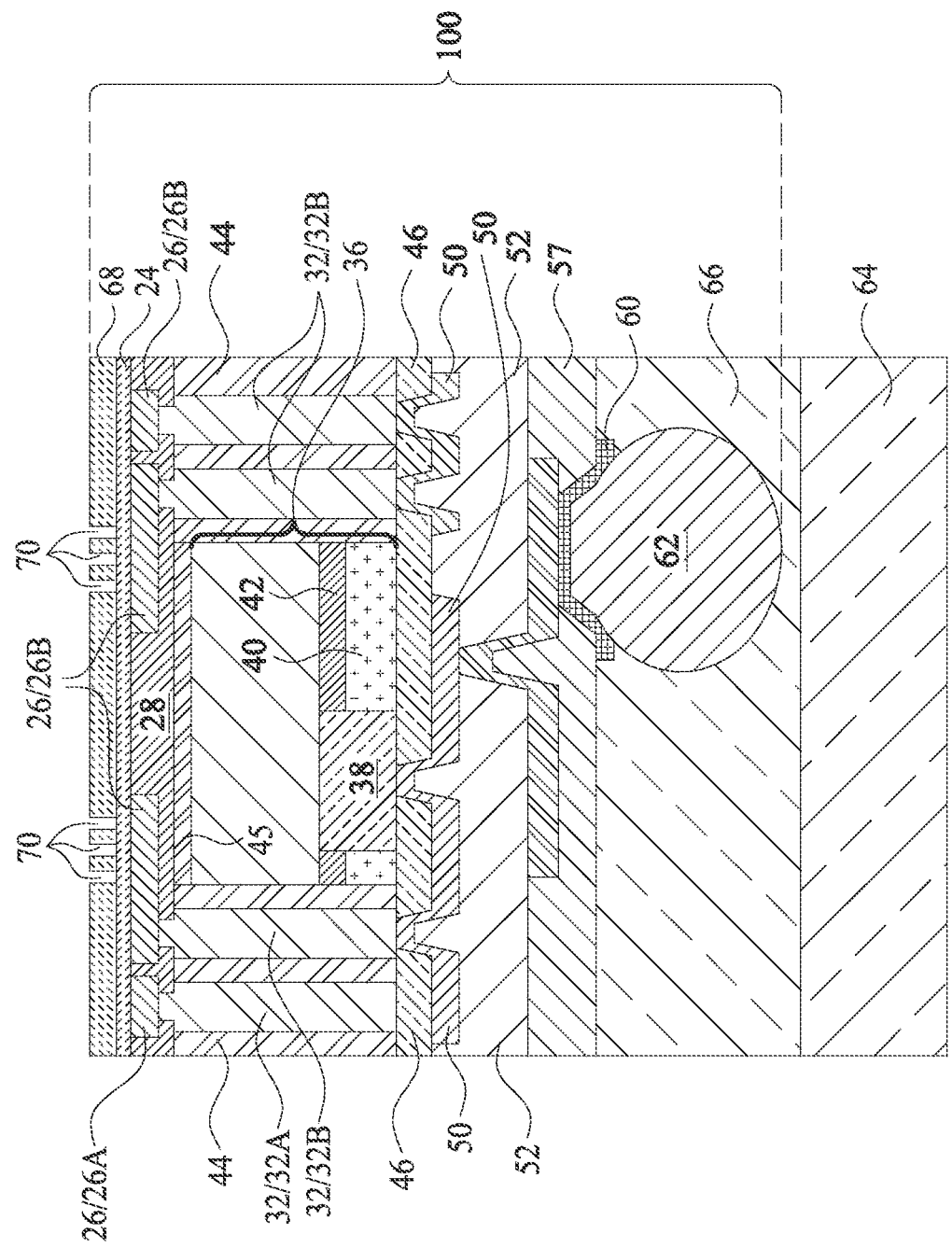

Next, package 100 is de-bonded from carrier 20. Adhesive layer 22 is also cleaned from package 100. The resulting structure is shown in FIG. 12. The de-bonding may be performed by projecting a light such as UV light or laser on adhesive layer 22 to decompose adhesive layer 22. In some embodiments, package 100 is further adhered to carrier 64 through adhesive 66, wherein electrical connectors 62 face, and may contact, adhesive 66.

Tape 68 is then adhered onto dielectric layer 24, which is exposed. Laser marking is then performed on tape 68 to form identification marks 70. Identification marks 70 are hence the recesses in tape 68 and may carry the identification information of the respective package. Identification marks 70 may include letters, number, or other identifiable patterns. The formation of identification marks 70 may be performed through laser drilling.

Figure 13:
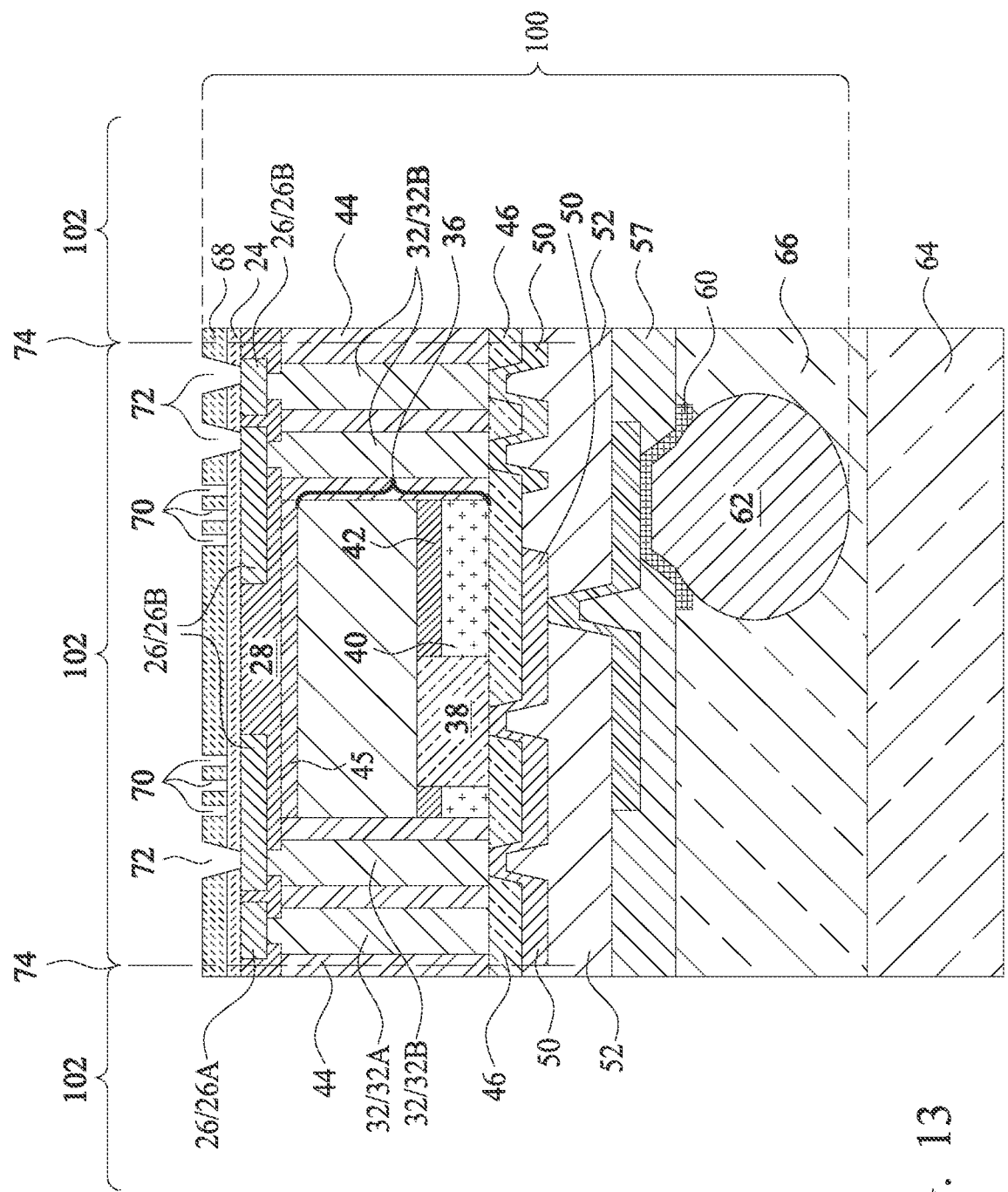

Referring to FIG. 13, openings 72 are formed in tape 68 and dielectric layer 24, and hence the metal pad portions of RDLs 56 are exposed to openings 72. The formation of openings 72 may be performed through laser drilling or photo lithography processes.

In subsequent steps, carrier 64 and adhesive 66 are removed from package 100. A die saw step is performed to saw package 100 into a plurality of packages 102, each including device die 36, through-vias 32B, and alignment marks 32A. In the die-saw step in accordance with some embodiments, kerves 74 are kept away from alignment marks 32A. Accordingly, the resulting package 102 includes both alignment marks 32A and through-vias 32B.

Figure 14:
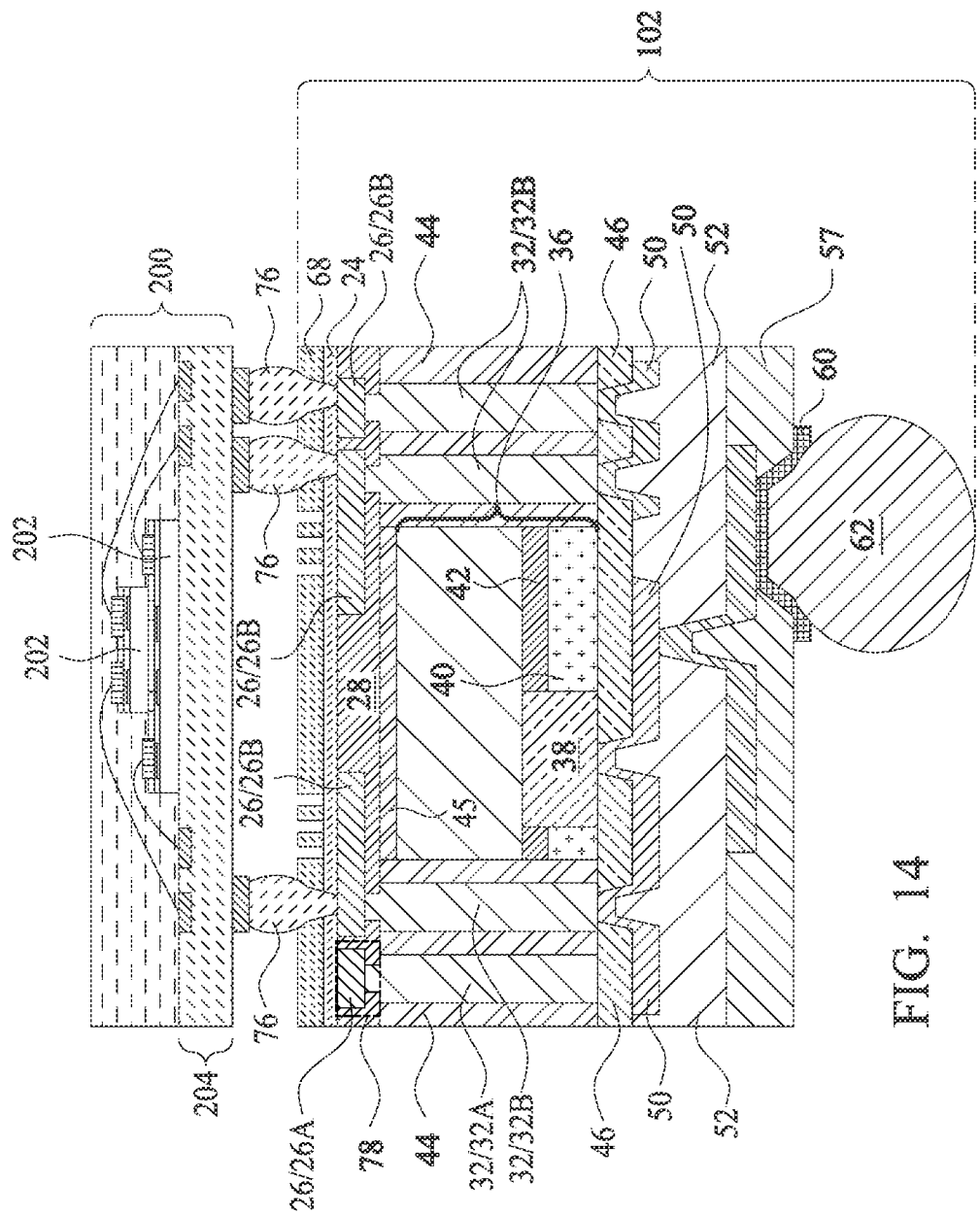

FIG. 14 illustrates the bonding of package 102 with another package 200. In accordance with some embodiments, the bonding is performed through solder regions 76, which join the metal pads in RDLs 26B to the metal pads in the overlying package 200. In some embodiments, package 200 includes device dies 202, which may be memory dies such as Static Random Access Memory (SRAM) dies, Dynamic Random Access Memory (DRAM) dies, or the like. The memory dies may also be bonded to package substrate 204 in some exemplary embodiments.

In the package 102 as shown in FIG. 13 or 14, alignment marks 32A may be electrically insulated from the integrated circuit devices in package 102 and 200. Alignment marks 32A may be electrically floating in some embodiments. In accordance with some embodiments, as shown in FIG. 14, through-via(s) 32A may be physically connected to some metal features, such as RDL(s) 26A. In alternative embodiments, the metal features in the dashed region 78 are not formed. This may be achieved by not forming RDL 26A in FIG. 2 and opening 30A in FIG. 3. When the metal features RDLs 26A are not formed, the entireties of the opposite surfaces (the illustrated top surface and bottom surface) of alignment mark 32A are not in contact with any conductive feature. Furthermore, each of alignment mark 32A and all of the conductive features (such as RDL 26A, if any) that are electrically connected to the alignment mark 32A as a whole may be fully insulated inside package 102 by dielectric layers and molding material 44.

Figure 15:
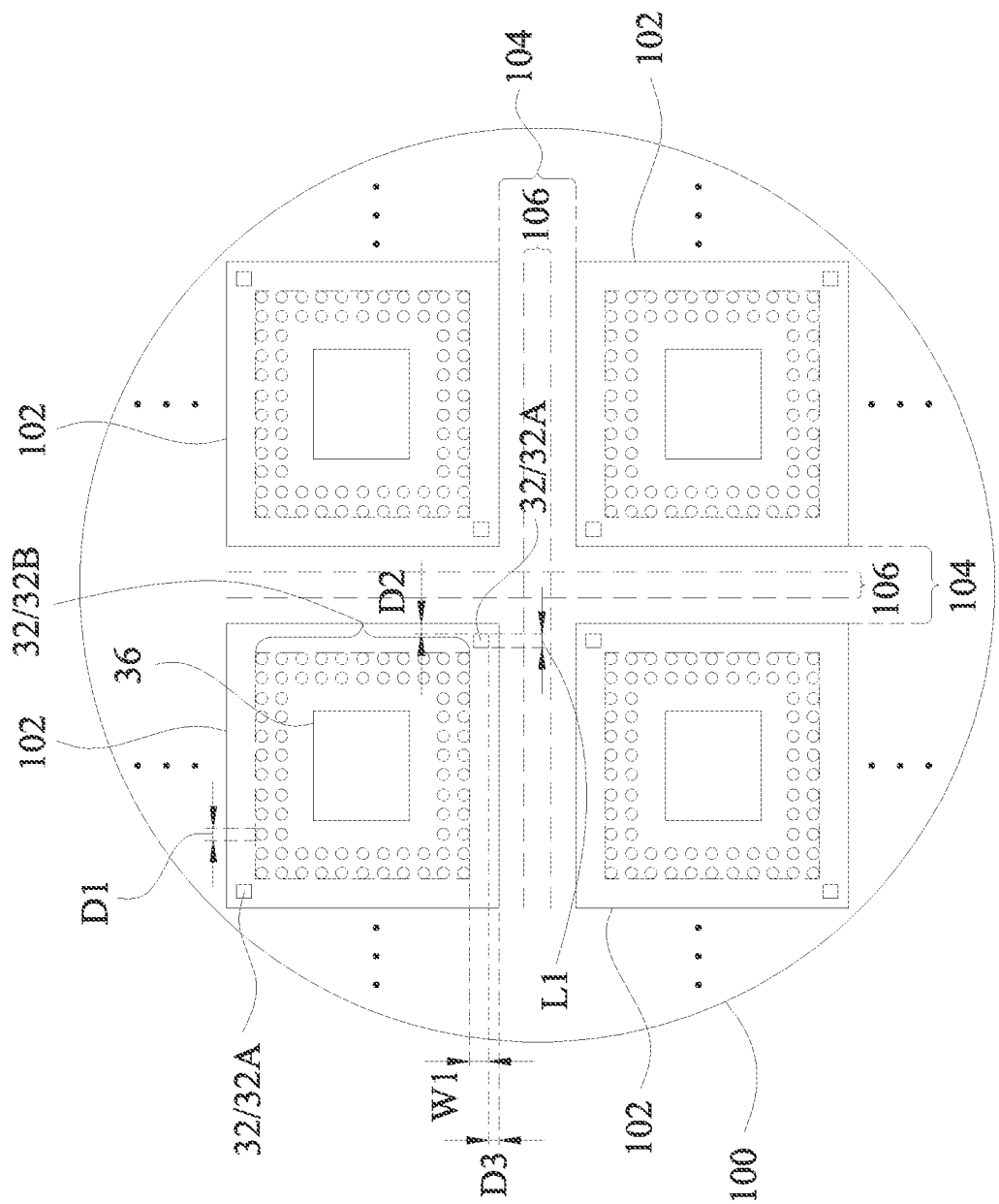
FIGS. 15 through 19 are top-views of exemplary packages including through-vias and alignment marks in accordance with some embodiments.

FIG. 15 schematically illustrates a top view of package 100 (FIG. 13), and the packages 102 in package 100. The relative sizes of packages 102 (relative to the size of package 100) are exaggerated in order to show the details of through-vias 32B and alignment marks 32A. As shown in FIG. 15, packages 102 are separated from each other by scribe lines 104, which are the regions in which the sawing kerves must pass through. The actual kerves are illustrated as 106 and are narrower than scribe lines 104. The widths of kerves 106 and scribe lines 104 are designed so that, with the variation in the sawing of package 100, kerves 106 are still within scribe lines 104.

Alignment marks 32A are outside of scribe lines 104 and hence will not be sawed. This is advantageous since alignment marks 32A have a height equal to the thickness of device die 36 (FIG. 13) and have large volumes, and hence alignment marks 32A may adversely affect the sawing process. On the other hand, alignment marks 32A are outside of design area 34 and hence can be easily identified during the alignment process.

In accordance with some embodiments, diameter D1 (or the length and the width of through-vias 32B) is in the range between about 150 µm and about 300 µm. The length L1 and width W1 of alignment marks 32A are in the range between about 100 µm and about 300 µm. Distance D2 and D3 between alignment marks 32A and scribe lines 104 are equal to or greater than the respective length L1 and width W1 of alignment marks 32A. It is appreciated, however, that the values recited throughout the description are merely examples and may be changed to different values.

Figure 16:
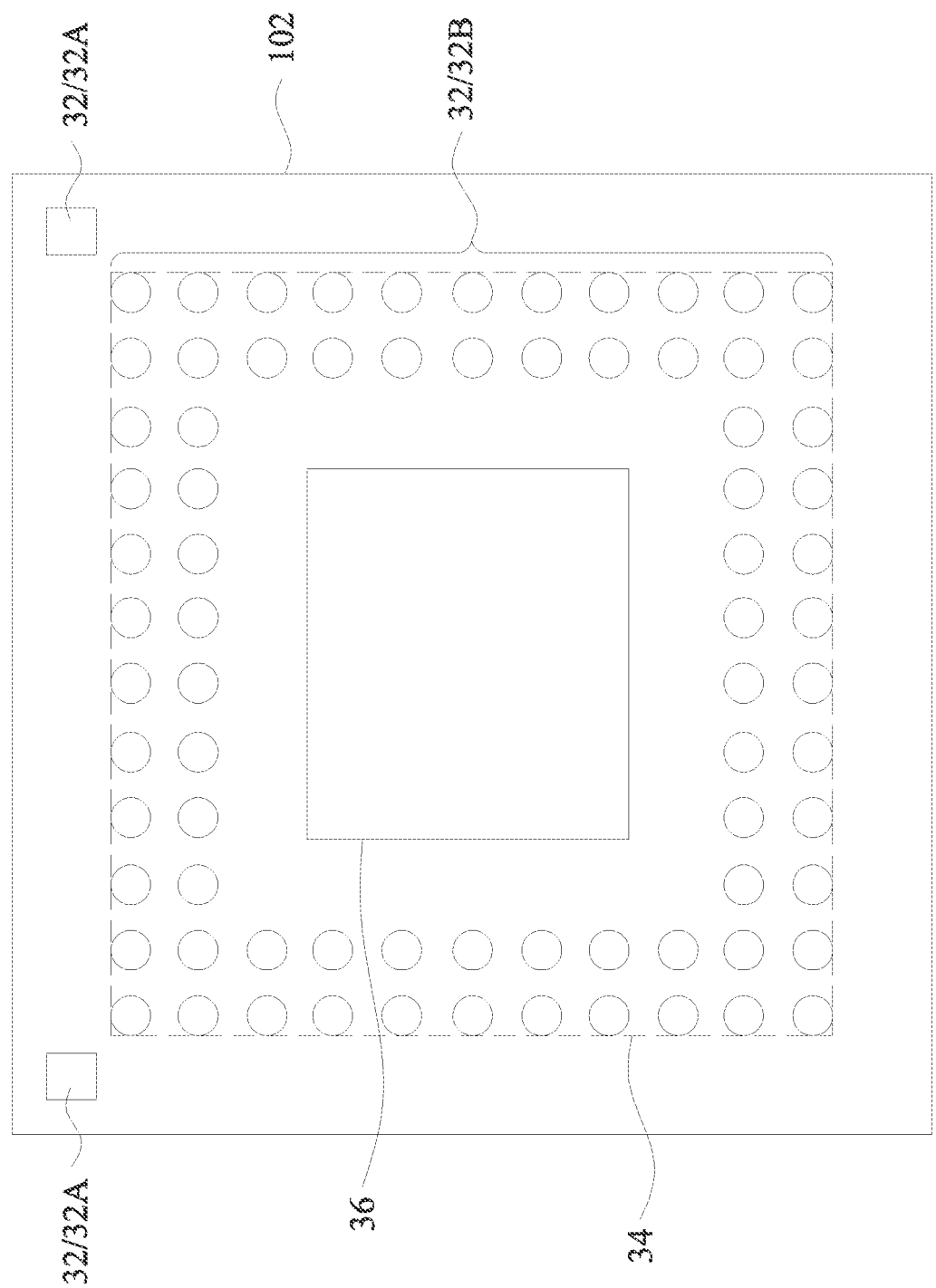
Figure 17:
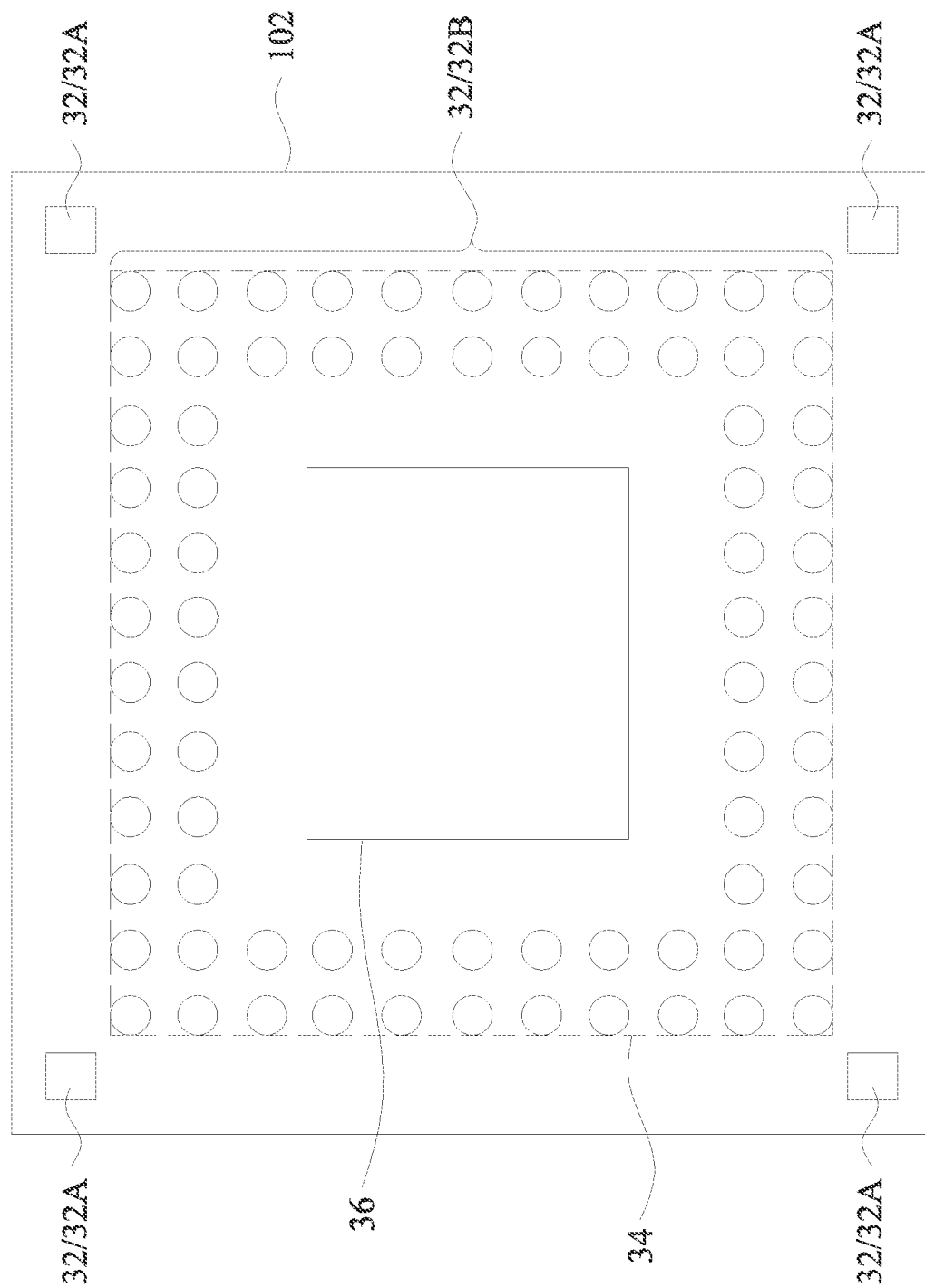

In the embodiments shown in FIG. 15, in each of packages 102, there are two alignment marks 32A placed diagonally, wherein the alignment marks 32A are adjacent to opposite corners of package 102. FIG. 16 illustrates the top view of package 102 in accordance with alternative embodiments, wherein two alignment marks 32A are formed adjacent to two corners of package 102, wherein the two corners are neighboring corners formed by a same edge of package 102. In the embodiments in FIG. 17, alignment marks 32A are formed adjacent to each of the four corners of package 102.

Figure 18:
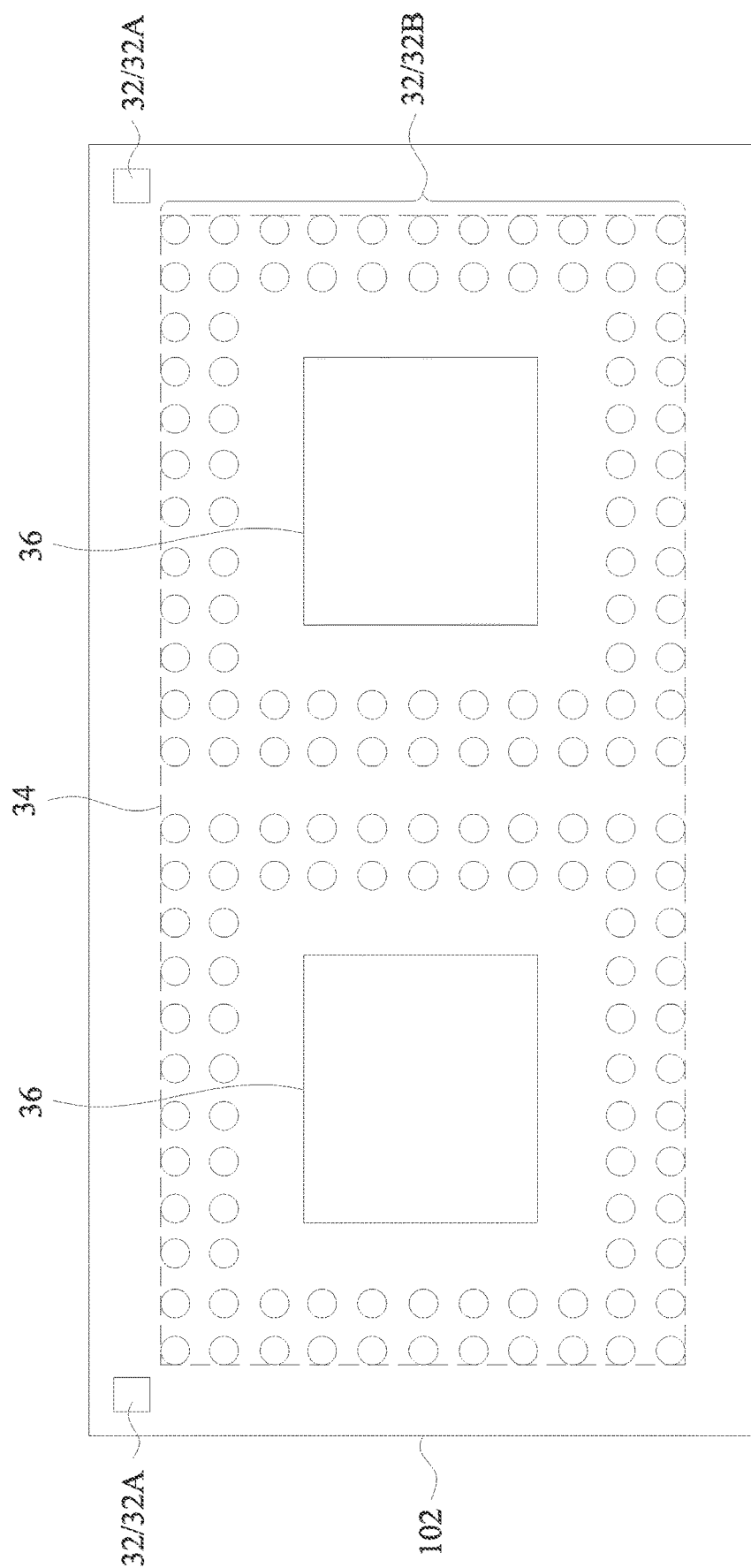

FIG. 18 illustrates the top view of package 102 in accordance with yet alternative embodiments, in which package 102 includes two or more device dies. For example, in the illustrated exemplary package 102, there are two device dies 36, each encircled by a plurality of through-vias 32B that form a ring. A joined design area 34 includes both device dies 36 and the respective surrounding through-vias 32B therein. Alignment marks 32A are again placed outside of the joined design area 34.

Figure 19:
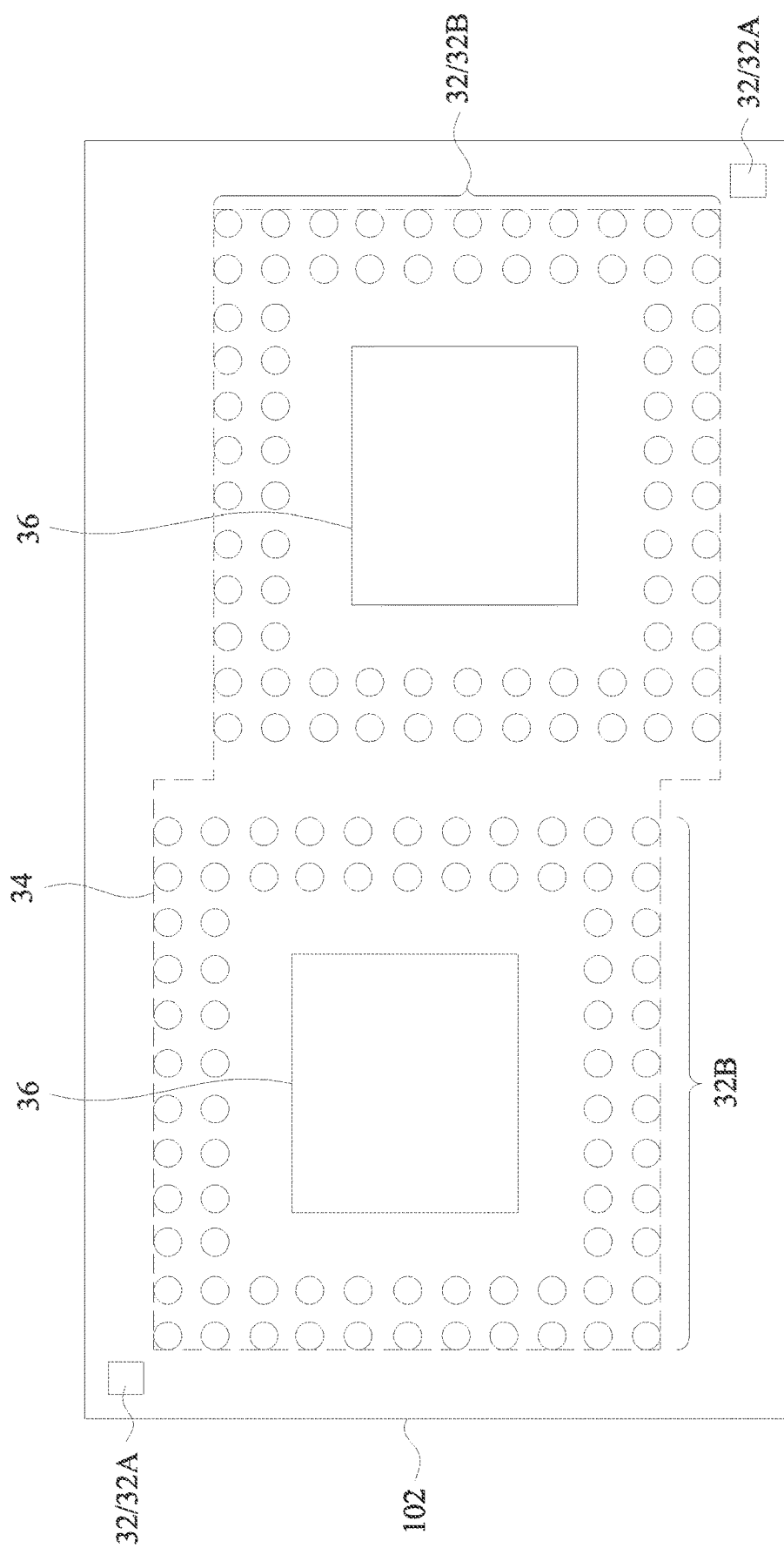

In FIG. 18, two device dies 36 are aligned with a straight line parallel to an edge of the respective package 102. FIG. 19 illustrates the top view of package 102, wherein device dies 36 are misaligned. In these embodiments, design area 34 is not a simple rectangular region. Rather, design area 34 includes two rectangular regions joined to each other.

In each of FIGS. 15 through 19, alignment marks 32A are also used for the alignment in the formation of the respective packages 102. The alignment process may be found referring to FIGS. 6 and 7.

Figure 20:
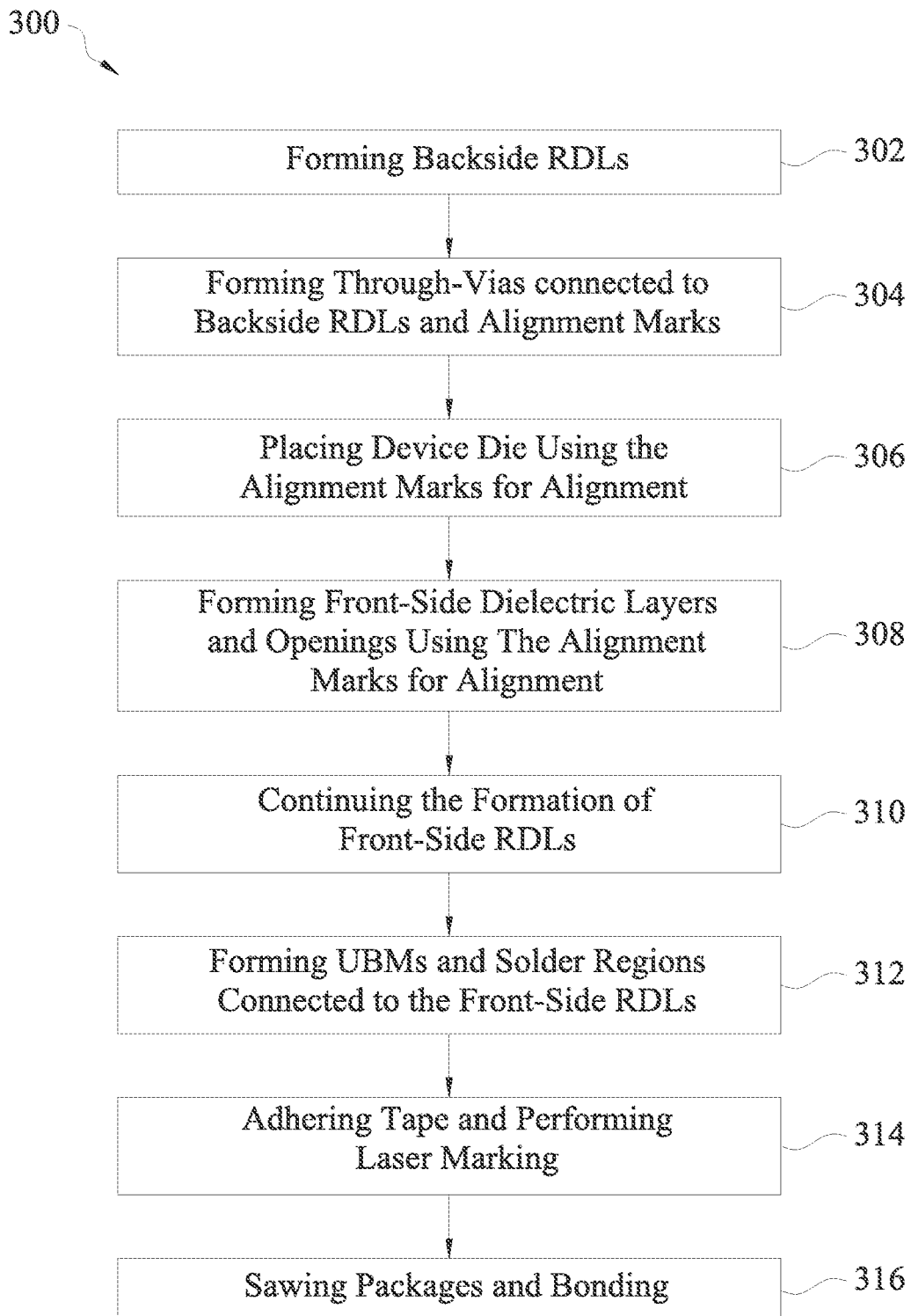
FIG. 20 illustrates a process flow in the formation of a package in accordance with some embodiments.

FIG. 20 schematically illustrates the process flow 300 for the processes in FIGS. 1 through 14. The process flow is briefly discussed herein. The details of the process flow may be found in the discussion of FIGS. 1 through 14. In step 302, backside RDLs 26 are formed on a carrier, as shown in FIGS. 1 through 3. In step 304 of the process flow in FIG. 20, through-vias 32B and alignment marks 32A are formed to connect to the backside RDLs 26, and the respective formation process is illustrated in FIGS. 4A and 4B. In step 306 of the process flow in FIG. 20, device die 36 is placed, and the respective formation process is illustrated in FIGS. 5A, 5B, and 5C. The placement of device die 36 is performed using alignment marks 32A for alignment. In step 308 and 310 of the process flow in FIG. 20, front-side RDLs 50 and 56 are formed, and the respective formation process is illustrated in FIGS. 6 through 9. The formation of openings in the bottom dielectric layer may also be performed using alignment marks 32A for alignment. In step 312 of the process flow in FIG. 20, UBMs 60 and solder regions 62 are formed, and the respective formation process is illustrated in FIGS. 10 and 11. In step 314 of the process flow in FIG. 20, tape 68 is adhered to the backside of the respective package, and the respective formation process is illustrated in FIG. 12. In step 316 of the process flow in FIG. 20, openings are formed, with UBMs and solder regions formed. The packages are sawed, and a further bonding process is performed. The respective formation process is illustrated in FIGS. 13 and 14.

The embodiments of the present disclosure have some advantageous features. By forming the alignment marks for each of the plurality of packages, the device dies may be accurately placed. The shifting and the rotation of the device dies relative to the through-vias are thus substantially eliminated or at least reduced. Furthermore, the alignment marks are formed at the same time the through-vias (for electrical connections) are formed, and hence no extra manufacturing cost is incurred.

In accordance with some embodiments of the present disclosure, a package includes a device die, a molding material molding the device die therein, a through-via penetrating through the molding material, and an alignment mark penetrating through the molding material. A redistribution line is on a side of the molding material. The redistribution line is electrically coupled to the through-via.

In accordance with alternative embodiments of the present disclosure, a package includes a device die including a metal pillar at a surface of the device die, a plurality of through-vias surrounding the device die, and an alignment mark. The alignment mark is electrically floating. A molding material molds the device die, the alignment mark, and the plurality of through-vias therein. A first plurality of redistribution lines is on a first side of the molding material. A second plurality of redistribution lines is on a second side of the molding material, with the second side being opposite to the first side. The first plurality of redistribution lines is electrically coupled to the second plurality of redistribution lines through the plurality of through-vias.

In accordance with yet alternative embodiments of the present disclosure, a method includes forming a through-via and an alignment mark simultaneously as well as placing a device die adjacent to the through-via and the alignment mark. The step of placing is performed using the alignment mark for alignment. The method further includes molding the through-via, the alignment mark, and the device die in a molding material and performing a planarization to expose the through-via, the alignment mark, and a metal pillar of the device die. A plurality of redistribution lines is formed to electrically connect to the through-via and the metal pillar of the device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first dielectric layer;
   performing a plating process to form an alignment mark over the first dielectric layer;
   placing a device die over the first dielectric layer, wherein the placing is performed using the alignment mark for aligning a position of the device die;

encapsulating the alignment mark in an encapsulant;
forming a second dielectric layer over and contacting the alignment mark and the encapsulant; and
forming a plurality of redistribution lines extend into the second dielectric layer and electrically connecting to the device die, wherein the plurality of redistribution lines are formed using the alignment mark for aligning positions, and wherein at a time after the plurality of redistribution lines are formed, the alignment mark is covered by the second dielectric layer, and wherein at a time after the plurality of redistribution lines are formed, a conductive feature is formed to comprise the alignment mark and an additional redistribution line electrically connected to the alignment mark, and wherein the conductive feature is fully insulated in dielectric features.

2. The method of claim 1, wherein the forming the plurality of redistribution lines comprises:
forming a seed layer; and
plating a metallic material on the seed layer.

3. The method of claim 2, wherein the seed layer is in physical contact with a metal pillar of the device die, and the seed layer is insulated from the alignment mark by the second dielectric layer.

4. The method of claim 1, wherein an entire top surface of the alignment mark is in physical contact with the second dielectric layer.

5. The method of claim 1 further comprising, in a common process for forming the alignment mark, forming a plurality of metal posts, wherein the plurality of redistribution lines are electrically connected to the plurality of metal posts.

6. The method of claim 1, wherein at a time after the plurality of redistribution lines are formed, the alignment mark is electrically floating.

7. The method of claim 1 further comprising:
before the forming the plurality of redistribution lines, forming an opening exposing the device die, wherein one of the plurality of redistribution lines extends into the opening to connect to the device die, and wherein the forming the opening is performed using the alignment mark for alignment.

8. The method of claim 7, wherein at a time after the plurality of redistribution lines is formed, the alignment mark in the encapsulant is overlapped by the second dielectric layer, and a top surface of the alignment mark is in contact with the second dielectric layer.

9. The method of claim 1 further comprising forming a plurality of dielectric layers covering the alignment mark and the device die, wherein the plurality of redistribution lines further extend into the plurality of dielectric layers.

10. The method of claim 1 further comprising performing a die-saw process to separate the encapsulant into a plurality of packages, wherein the alignment mark is in one of the plurality of packages.

11. The method of claim 1, wherein the encapsulating the alignment mark in the encapsulant comprises molding the alignment mark in a molding compound.

12. A method comprising:
forming a first redistribution line;
forming an alignment mark over and electrically connecting to the first redistribution line, wherein the forming the alignment mark comprises plating;
depositing a dielectric layer over the alignment mark; and
forming a plurality of redistribution lines comprising first portions over the dielectric layer, and second portions extending into the dielectric layer, wherein the plurality of redistribution lines are formed using the alignment mark for aligning, and wherein at a time after the plurality of redistribution lines are formed, a conductive feature comprising the alignment mark and the first redistribution line is fully insulated in dielectric features.

13. The method of claim 12 further comprising:
forming a plurality of openings in the dielectric layer, with the second portions of the plurality of redistribution lines being in the plurality of openings, wherein the forming the plurality of openings is performed using the alignment mark for aligning positions.

14. The method of claim 12, wherein the first redistribution line is electrically coupled to the alignment mark, and wherein both of the alignment mark and the first redistribution line are electrically floating.

15. The method of claim 12 further comprising a die-saw process to form a package, wherein in the package, the alignment mark is electrically floating.

16. The method of claim 12 further comprising forming a plurality of metal posts, wherein each of the plurality of metal posts electrically interconnects features on opposite sides of the encapsulant, and wherein the plurality of metal posts define a rectangular design area in a top view of the plurality of metal posts and the alignment mark, and the alignment mark is outside of the rectangular design area.

17. A method comprising:
forming a first redistribution line;
forming a first dielectric layer covering the first redistribution line;
forming an electrically conductive via in the first dielectric layer;
forming an alignment mark over and joined to the electrically conductive via;
encapsulating a device die and the alignment mark in an encapsulant;
forming a second dielectric layer over and contacting the device die and the alignment mark; and
forming a plurality of redistribution lines over the encapsulant, with the alignment mark used for aligning positions of the plurality of redistribution lines, wherein the plurality of redistribution lines comprise a portion extending into the second dielectric layer to contact a top surface of a metal pillar in the device die, and wherein after the plurality of redistribution lines are formed, a combined conductive region comprising the alignment mark and the first redistribution line is fully insulated in dielectric features.

18. The method of claim 17, wherein the electrically conductive via and the alignment mark are formed in a single plating process.

19. The method of claim 17, wherein after the plurality of redistribution lines are formed, an entire top surface of the alignment mark is in contact with the first dielectric layer.

20. The method of claim 17, wherein at a time after the plurality of redistribution lines are formed, the alignment mark is electrically floating.

* * * * *